United States Patent [19]

Tamura

[11] Patent Number: 5,089,786
[45] Date of Patent: Feb. 18, 1992

[54] OPTICAL AMPLIFIER

[75] Inventor: Yasuaki Tamura, Tokyo, Japan

[73] Assignee: Oki Electric Industry Co., Ltd., Tokyo, Japan

[21] Appl. No.: 540,498

[22] Filed: Jun. 19, 1990

[30] Foreign Application Priority Data

Jun. 26, 1989 [JP] Japan ................. 1-160925

[51] Int. Cl.$^5$ ............. H01S 3/10; G02B 5/30; G02B 6/28
[52] U.S. Cl. ................................. 359/333; 359/484
[58] Field of Search ........ 330/4.3; 350/377, 385–388; 455/606, 610, 616

[56] References Cited

U.S. PATENT DOCUMENTS

| | | | |
|---|---|---|---|
| 3,668,536 | 6/1972 | Michon | 330/4.3 |
| 4,757,268 | 7/1988 | Abrams et al. | 330/4.3 |
| 4,794,344 | 12/1988 | Johnson | 330/4.3 |
| 4,805,977 | 2/1989 | Tamura et al. | 350/96.16 |
| 4,918,395 | 4/1990 | Difonzo et al. | 372/92 |
| 4,941,738 | 7/1990 | Olsson | 350/377 |
| 4,972,156 | 11/1990 | Gregor et al. | 372/25 |

FOREIGN PATENT DOCUMENTS

| | | | |
|---|---|---|---|
| 0352974 | 1/1990 | European Pat. Off. | |
| 224283 | 9/1988 | Japan | 330/43 |

OTHER PUBLICATIONS

Olsson, "Polarisation-Independent Configuration Optical Amplifier", Electronics Letters, vol. 24, No. 17, Aug. 18, 1988, pp. 1075–1076.
Iwamura et al, "Simple Polarisation-Independent Optical Circulator for Optical Transmission Systems", Electronics Letters, vol. 15, No. 25, Dec. 6, 1979, pp. 830–831.
Emkey, "A Polarization-Independent Optical Circulator for 1.3 μm", J. Lightwave Technology, vol. LT-1, No. 3, 1983, pp. 466–469.
Tamura et al; "A Travelling-Wave Optical Amplifier Module"; 14th Europ. Conf. Opt. Comm., ECOC88, 9/15/88, pp. 491–4; Abst. only supplied.
Sinha et al; "Evidence of Polarization Dependent Gain . . ."; Opt. Comm., vol. 73, #3, pp. 239–43, 10/1/89; Abst. only supplied.

*Primary Examiner*—Nelson Moskowitz
*Attorney, Agent, or Firm*—Spencer & Frank

[57] ABSTRACT

In an optical amplifier, light incident on a first port of a port separator is emitted out of a third port, and is input into and amplified in a semiconductor laser. Amplified light receives the first amount of rotation, e.g., a 45° rotation, of the direction of polarization in a Faraday rotator assembly and is emitted outward. Light emitted out of the Faraday rotator assembly is reflected by the reflector. Passed through the Faraday rotator assembly backward, receives the second amount of rotation, e.g., a further 45° rotation, of the direction of polarization in the same direction as the previous rotation, and is input into the semiconductor laser. The input light is amplified again in the semiconductor laser, is input in the third port of the port separator, and is emitted outward from a second port. The direction of polarization of light passing forward and backward through the semiconductor laser are orthogonal to each other, and therefore amplification will be done at a constant degree of amplification, regardless of the direction of polarization.

4 Claims, 4 Drawing Sheets

PRIOR ART

FIG. 6

OPTICAL AMPLIFIER

FIELD OF THE INVENTION

The invention relates to optical amplifiers which directly amplify an optical signal.

BACKGROUND OF THE INVENTION

Among optical amplifiers that utilize a semiconductor laser, traveling-wave optical amplifiers are anticipated to be applied in the optical communication industry field in the future, because they have benefits of a wide signal-wavelength band over which they are capable of amplification, and of an extremely fast response-speed with regards to optical signals.

The traveling-wave optical amplifier achieves an amplifying capability by suppressing self-oscillation by the provision of a non-reflective coating on input and output ends of a semiconductor laser; and light injected through a surface of one end of a semiconductor laser chip is amplified inside that chip and appears on the other end as an output. Furthermore, light amplification is performed regardless of the direction of traveling of light inside the semiconductor laser chip, i.e., in any direction in he chip. Therefore, if one of two ends of a semiconductor laser chip is made non-reflective and the other end is made reflective, then light injected from the non-reflective end will be amplified in the semiconductor laser chip, reach the reflective end, and, due to the reflective surface at this end, be reflected to change its direction, whereupon the light will once again be amplified inside the semiconductor chip, reach the non-reflective end, and be emitted outward. An optical amplifier can therefore be obtained, by externally providing an optical circuit having the function of separating light that is input from light that is output.

Figure 2:
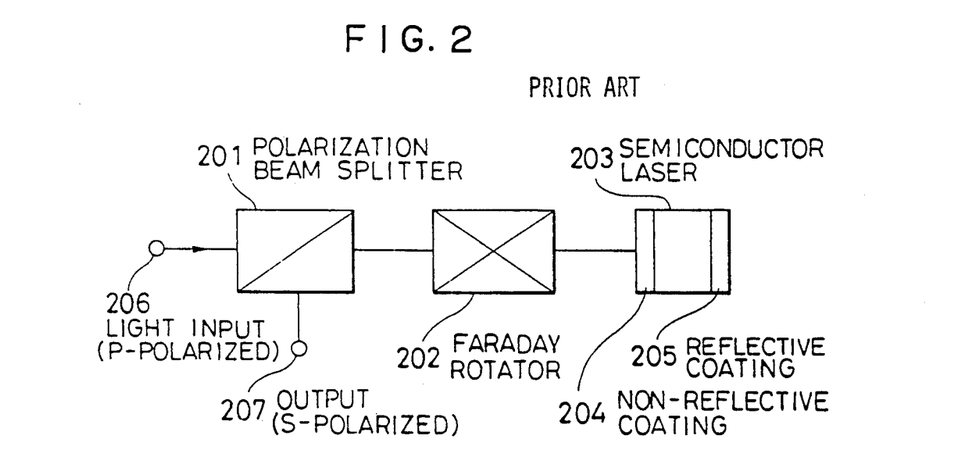
FIG. 2 is a block diagram showing the principle of an optical amplifier of the prior-art.

FIG. 2 is a block diagram showing a prior art example (for example, Japanese Patent Application Kokai Publication No. 224283/1988) of an optical amplifier of this type. 201 is a polarization beam splitter, 202 is a Faraday rotator assembly, 203 is a semiconductor laser having a non-reflective coating 204 at an end and a reflective coating 205 at the other. First, input light having a linearly polarized wave that is P-polarized with respect to the polarization beam splitter 201 is passed through the polarization beam splitter 201 and is optionally rotated 45° by the Faraday rotator assembly 202. The light is then injected into the semiconductor laser 203 and amplified. The amplified light is reflected at the reflective coating 205, amplified again, and emitted outward through the injection end. The light emitted outward is once again optically rotated 45° by the Faraday rotator assembly 202. Therefore, the rotated light has a direction of polarization at an angle of 90° relative to the input light; and light at the output port 207 is S-polarized with respect to the polarization beam splitter 201. In short, the illustrated assembly acts as a reflective-type optical amplifier in which light from the input port 206 is amplified and appears at the output port 207.

However, the optical amplifier described above has a drawback in that there is an amplifying effect only when an input optical signal is incident as P-polarized light with respect to the polarization beam splitter 201: when he light contains other polarization components, that light is reflected by the polarization beam splitter 201 and does not reach the semiconductor laser 203; thereby, the degree of amplification depends on the direction of polarization of the input optical signal; and certain restrictions concerning the direction of polarization of the input optical signal must be met in order for the assembly to achieve the desired function.

For example, when an optical amplifier is used in an optical repeater or the like, the direction of polarization of light propagated in an optical fiber varies due to the physical environment of the optical fiber including pressure on the fiber, bending, or temperature; therefore, the direction of polarization of an input optical signal input to an optical amplifier is not constant. Thus it is unclear with what direction of polarization the light will arrive; and consequently, it is necessary to place a polarization controller at the input stage of the optical amplifier and to operate it in such a way that a P-polarized-wave is always injected. For this reason, there was much hope for an appearance of an optical amplifier having a constant degree of amplification independent of the direction of polarization of an input optical signal.

SUMMARY OF THE INVENTION

The invention removes the above mentioned drawback and has as its purpose the provision of an optical amplifier having, independent of the direction of polarization of an input optical signal, a constant degree of amplification for input optical signals having an arbitrary direction of polarization.

In order to reach the above objectives, the invention is provided with:

a port separator that has first, second, and a third ports, and that, regardless of the direction of polarization, emits outward from the third port, light which has been incident on the first port, and emits outward from the second port light which is incident on the third port;

a semiconductor laser that has first and second non-reflective ends, that emits outward from the second end, light which has been incident on the first end and amplified, and that emits outward, from the first end, light which has been incident on the second end and amplified, the first end of the semiconductor laser being optically coupled with the third port of the port separator;

a Faraday rotator assembly that has first and second ends, that imparts a first amount of rotation to the direction of polarization of light incident on the first end and emits that light from the second end, and that imparts a second amount of rotation to the direction of polarization of light incident on the second end and emits that light from the first end, the sum of the first amount of rotation and the second amount of rotation being 90°;

the first end of the Faraday rotator being optically coupled with the second end of the semiconductor laser; and a reflector that reflects light coming from the second end of the Faraday rotator and returns it back towards the second end of the Faraday rotator.

Light incident on the first port of the port separator is emitted out of the third port, and is input into and amplified in the semiconductor laser. Amplified light receives the first amount of rotation, e.g., a 45° rotation, to the direction of polarization in a Faraday rotator assembly and is emitted outward. Light emitted outward is reflected by the reflector, returns back to the Faraday rotator assembly, receives the second amount of rotation, e.g., a further 45° rotation, to the direction of polarization in the same direction as the previous rotation, and is input into the semiconductor laser. The input light is amplified, is input in the third port of the port separator, and is emitted outward from the second port. The polarization direction of light passing forward and backward through the semiconductor laser are perpendicular to each other, and therefore amplification will be done at a constant degree of amplification, regardless of the direction of polarization.

DETAILED DESCRIPTION OF THE PREFERRED EMBODIMENTS

Figure 1:
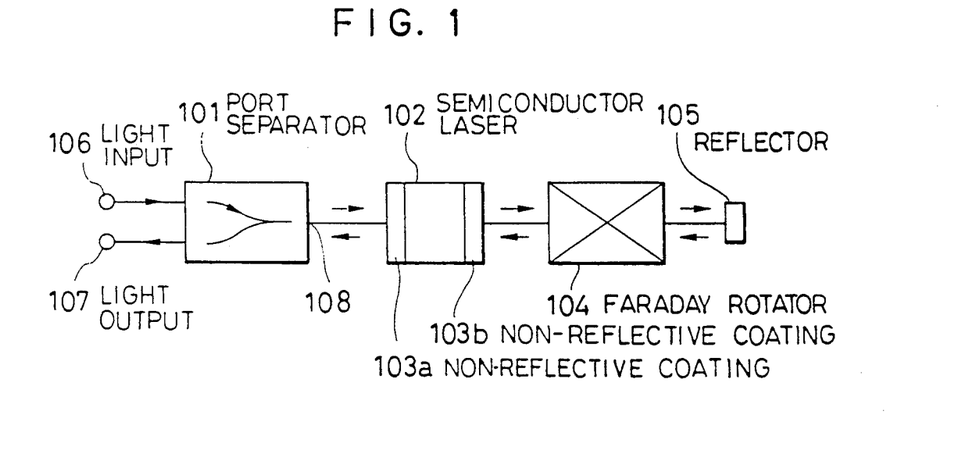
FIG. 1 is a block diagram showing the principle of the invention.

FIG. 1 is a block diagram showing the principle of the invention. 101 is a port separator, 102 is a semiconductor laser, 104 is a Faraday rotator assembly, 105 is a reflector, and 106 through 108 are ports.

The port separator 101 emits outward from the port 108 light incident on the port 106, emits outward through the port 107 light incident on the port 108, and has a function such that light input at the port 107 is not returned to the port 106. This function is valid for light having an arbitrary direction of polarization: it does not depend on the direction of polarization of light.

The semiconductor laser 102 is an ordinary semiconductor laser chip in which the degree of optical amplification varies with the direction of polarization of of light input into the laser; the degree of optical amplification for light having a direction of polarization parallel to that junction interface is large, in comparison to the degree of amplification for light having a direction of polarization perpendicular to that junction interface; and the difference is generally 5 to 7 dB. In addition, non-reflective layers 103a and 104b have been vapor-deposited on the ends of this semiconductor laser 102 for the purpose of preventing laser oscillation.

The Faraday rotator assembly 104 is a non-reciprocal element that imparts 90° rotation to the direction of polarization of light as the light propagates forward and then backward. For instance, it imparts a 45° rotation (in one direction, e.g., the clockwise direction, as viewed in the direction of travel) to light propagating forward, i.e., from the left to the right in the Figure, and it imparts a further 45° rotation (in the other direction, i.e., the counterclockwise direction, as viewed in the direction of travel) to the light propagating backward, i.e., from the right to the left in the Figure.

Next, the action of the optical amplifier will be described in reference to the block diagram shown in FIG. 1.

First, light incident on the port 106 passes through the port separator 101 and is emitted outward from the port 108. Light emitted outward is incident on the semiconductor laser 102 and is amplified while passing through the semiconductor laser 102. During this passage, a light component having a direction of polarization parallel to the junction interface of the semiconductor laser 102 receives a large amplifying effect, and a light component having a direction of polarization perpendicular to the junction interface receives a small amplifying effect. The optically amplified light is input into the Faraday rotator assembly 104, receives a 45° rotation (in one direction, e.g., the clockwise direction, as viewed in the direction of travel) of the direction of polarization, and is emitted outward. The light emitted outward is reflected by the reflector 105 and returns to the Faraday rotator assembly 104; the direction of polarization of that light is rotated 45° (in the opposite direction, e.g., the counterclockwise direction, as viewed in the direction of travel). This rotation adds to the rotation during the forward travel. The net result is that the light as input from the semiconductor laser 102 to the Faraday rotator assembly 104 in the course of the forward travel and the light as output from the Faraday rotator assembly 104 and input into the semiconductor laser 102 in the course of backward travel have directions of polarization perpendicular to each other. In other words, as light travels forward through the Faraday rotator assembly 104, is reflected at the reflector 105, and then travels backward through the Faraday rotator assembly 104, its direction of polarization receives a 90° rotation.

Light which has received a 90° rotation once again goes through the semiconductor laser 102 in the backward direction and receives an amplifying action. This time, the light component which previously received only a small amplifying effect since its direction of polarization was perpendicular to the junction interface of the semiconductor laser 102 will now have its direction of polarization parallel to the junction interface and will therefore receive a large amplifying effect; and conversely, the light component which previously received a large amplifying effect since its direction of polarization was parallel to the junction interface will now have its direction of polarization perpendicular to the junction interface and will therefore receive only a small amplifying effect. Consequently both components will receive the same amplification effect as they propagate forward and backward through the semiconductor laser 102; and a constant amplification can be performed for light having an arbitrary direction of polarization, i.e., regardless of the direction of polarization of the light component. The amplified light is then incident on the port separator 101 via the port 108 and emitted out of the port 107 to become the output light.

In this way, an optical amplifier which is not dependent on the polarization direction and in which light incident on the port 106 receives a constant amplification regardless of its direction of polarization, and is emitted out of the port 107 can be obtained.

Next, a first example of port separator 101 will be explained in reference to FIG. 3. The port separator of this example comprises first and second polarization beam splitters 310 and 320, and a polarization controller 303.

The first polarization beam splitter 310 has first, second, third and fourth ports 311, 312, 313 and 314, while the second polarization beam splitter 320 has first, second and third ports 321, 322 and 323. The first and the fourth ports of the first polarization beam splitter 310 constitute the first and the second ports 106 and 107 of the port separator 101. The third port 323 of the second polarization beam splitter 320 constitute the third port 108 of the port separator 101.

The first polarization beam splitter 310 receives input or forward light at the first port 311, splits, at a polarization splitting plane 315, the input light into a first forward light component which is P-polarized with respect to the polarization splitting plane 315, i.e., has a direction of electric field polarization parallel to the polarization splitting plane 315, and a second forward light component which is S-polarized with respect to the polarization splitting plane 315, i.e., has a direction of electric field polarization perpendicular to the polarization splitting plane 315, reflects the second forward light component at a reflecting plane 316, and emits the first and the second forward light components, from the second and the third ports 312 and 313.

The polarization controller 303 has first and second ends 331 and 332, receives the first and the second forward light components at the first end 331, permits passage of the first and the second end 332 along paths A and B in the forward (left to right in the Figure) direction, imparts no net rotation to the first and the second forward light components as they travel from the first end 331 to the second end 332, and emits the first and the second forward light components from the second end 332.

The second polarization beam splitter 320 receives, at the first and the second ports 321 and 322, the first and the second forward light components emitted from the second end 332 of the polarization controller 303, reflects the second forward light component at a reflecting plane 326, and merges the first and the second forward light components at a polarization splitting plane 325, and emits the merged forward light components from the third port 323, toward the semiconductor laser 102.

The second polarization beam splitter 320 receives, at the third port 323, light, called backward light, from the semiconductor laser 102, splits, at the polarization splitting plane 325, the received backward light into a first backward light component which is P-polarized with respect to the polarization splitting plane 325, i.e., has a direction of polarization parallel to the polarization splitting plane 325, and a second backward light component which is S-polarized with respect to the polarization splitting plane 325, i.e., has a direction of polarization perpendicular to the polarization splitting plane 325, and emits the first and the second backward light components from the first and the second ports 321 and 322.

The polarization controller 303 receives the first and the second backward light components at the second end 332, and permits passage of the first and the second backward light components from the second end 332 to the first end 331 along the paths A and B in a backward (right to left in the Figure) direction, imparts a 90° net rotation to the first and the second backward light components as they travel from the second end 332 to the first end 331, emits the first and the second backward light components at the first end 331.

The first polarization beam splitter 310 receives at the second and the third ports 312 and 313, the first and the second backward light components, reflects the second backward light component at the reflecting plane 316, merges them at the polarization splitting plane 315, reflects them at a reflecting plane 317, and emits the merged backward light components from the fourth port 314.

The polarization controller 303 comprises light-rotators 302a and 302b, each of which imparts a rotation of 22.5° to light traveling through it, and a Farady rotator assembly 330 comprising a Faraday rotator 304, provided with an annular magnet 305 surrounding the Faraday rotator 304, having magnetic poles, N and S, at the right and left (as seen in the Figure) ends to create, in the Faraday rotator 304, a magnetic field which is parallel to the direction of travel of light. The Faraday rotator 304 imparts a rotation of 45° to light traveling through it. The direction of rotation given by the light rotators 302a and 302b is invariable, e.g., clockwise, as viewed in the direction of travel. The direction of rotation given by the Faraday rotator 304 depends on the direction of travel. For light traveling forward, the direction of rotation given by he Faraday rotator 304 is reverse to the direction of rotation given by he light rotators 302a and 302b, i.e., counterclockwise. For light traveling backward, the direction of rotation given by the Faraday rotator is the same as the direction of rotation given by the light rotators 302a and 302b, i.e., clockwise. The net rotation through the polarization controller 303 during the forward travel is therefore zero, while the net rotation through the polarization controller 302 during the backward travel is 90°.

First, light input from port 106 is split into the first forward light component (P-polarized with respect to the polarization splitting plane 315) and a second forward light component (S-polarized with respect to the polarization splitting plane 315) at the polarization splitting plane 315. The P-polarized, first forward light component propagates through the polarization controller 303 along a path A in FIG. 3; the S-polarized, second forward light component propagates along a path B; and both arrive at the second end 332. The directions of polarization of the first and the second forward light components which have arrived receive, as they pass through the polarization controller 303, a 45° rotation due to the Faraday rotator 304 and, in addition, a 45° rotation in the reverse direction due to light-rotators 302a and 302b; therefore, the net rotation is zero, i.e., the directions of polarization of the light components as they are output at the second end 332 are the same as the directions of polarization as they are input at the first end 331.

The two light components emitted at the second end 332 are input to the second beam splitter 320. The light component having traveled along the path A is P-polarized with respect to (has a direction of polarization parallel to) the polarization splitting plane 325, and hence passes the polarization splitting plane 325, while the light component having traveled along the path B is S-polarized with respect to the polarization splitting plane 325, and is therefore reflected at the polarization splitting plane 325. The two light components are therefore merged at the polarization splitting plane 325, and are emitted out from port 323.

On the other hand, light (backward light) input from the semiconductor laser 102 into the port 323 is split into a first backward light component which is P-polarized with respect to the polarization splitting plane 325 and a second backward light component which is S-polarized with respect to the polarization splitting plane 325, at the polarization splitting plane 325. The P-polarized light and the S-polarized light propagate through the polarization controller 303 along paths shown by A and B, respectively in FIG. 3, in the backward direction. As they travel, they receive a 45° rotation due to the Faraday rotator 304 and, in addition, a 45° rotation in the same direction due to light-rotators 302a and 302b; therefore, the net rotation is 90°, i.e., the directions of polarization of the light components as they are output at the first end 331 are rotated 90° with respect to the directions of polarization as they are input at the second end 332. The light component having traveled along the path A is S-polarized with respect to the polarization splitting plane 315, and hence is reflected at the polarization splitting plane 315, while the light component having traveled along the path B is P-polarized with respect to the polarization splitting plane 315, and therefore passes through the polarization splitting plane 315. The two light components are therefore merged at the polarization splitting plane 315, and are emitted out from the port 314.

As explained above, the port separator of the above configuration separates light from the port 106 and directs it to the port 108 and separates light from the port 108 and directs it to the port 107; and furthermore, this function is valid for light having an arbitrary direction of polarization.

Figure 4:
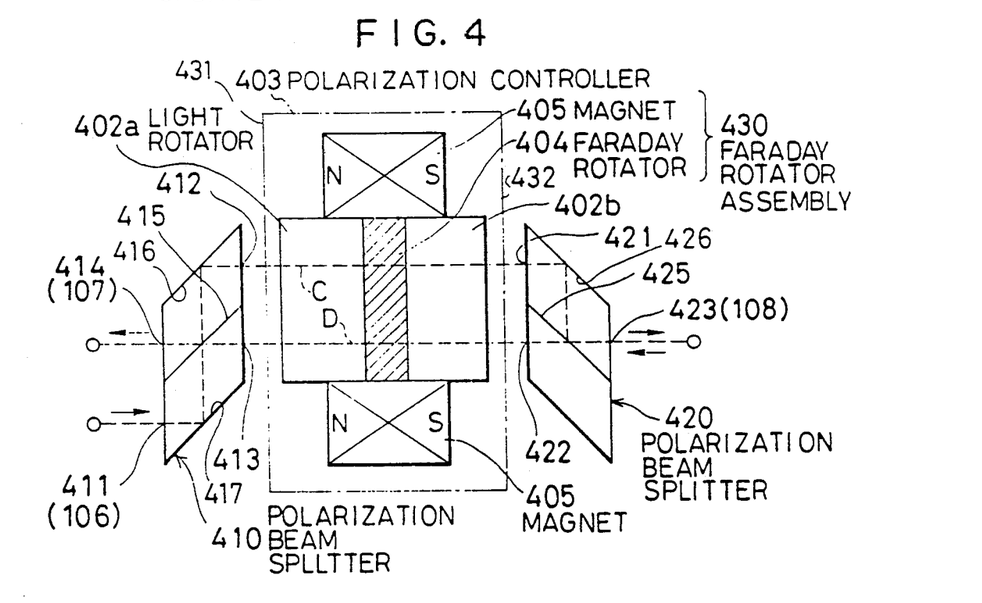
FIG. 4 is a configuration diagram showing a second example of a port separator according to the invention.

FIG. 4 shows a second example of port separator 101 shown in FIG. 1. The port separator of this example comprises first and second polarization beam splitters 410 and 420, and a polarization controller 403.

The first polarization beam splitter 410 has first, second, third and fourth ports 411, 412, 513 and 414, while the second polarization beam splitter 420 has first, second and third ports 421, 422 and 423. The first and the fourth ports of the first polarization beam splitter 410 constitutes the first and the second ports 106 and 107 of the port separator 101. The third port 423 of the second polarization beam splitter 420 constitutes the third port 108 of the port separator 101.

The first polarization beam splitter 410 receives input or forward light at the first port 411, reflects the light at a reflecting plane 417, splits, at a polarization splitting plane 415, the input light into a first forward light component which is P-polarized with respect to the polarization splitting plane 415, and a second forward light component which is S-polarized with respect to the polarization splitting plane 415, reflects the first forward light component at a reflecting plane 416, and emits the first and the second forward light components, from the second and the third ports 412 and 413.

The polarization controller 403 has first and second ends 431 and 432, receives the first and the second forward light components at the first end 431, permits passage of the first and the second forward light components from the first end 431 to the second end 432 along the paths C and D in the forward direction, imparts a 90° net rotation to the first and the second forward light components as they travel from the first end 431 to the second end 432, and emits the first and the second forward light components from the second end 432.

The second polarization beam splitter 420 receives, at the first and the second ports 421 and 422, the first and the second forward light components emitted from the second end 432 of the polarization controller 403, reflects the first forward light component at a reflecting plane 426, and merges the first and the second forward light components at a polarization splitting plane 425, and emits the merged forward light components from the third port 423, toward the semiconductor laser 102.

The second polarization beam splitter 420 receives, at the third port 423, light, called backward light, from the semiconductor laser 102, splits, at the polarization splitting plane 425, the received backward light into a first backward light component which is P-polarized with respect to the polarization splitting plane 425, and a second backward light component which is S-polarized with respect to the polarization splitting plane 425, and emits the first and the second backward light components from the first and the second ports 421 and 422.

The polarization controller 403 receives the first and the second backward light components at the second end 432, and permits passage of the first and the second backward light components from the second end 432 to the first and 431 along paths C and D in the backward direction, imparts no net rotation to the first and the second backward light components as they travel from the second end 432 to the first end 431, emits the first and the second backward light components at the first end 431.

The first polarization beam splitter 410 receives at the second and the third ports 412 and 413, the first and the second backward light components, reflects the first backward light component at the reflecting plane 416, merges them at the polarization splitting plane 415, and emits the merged backward light components from the fourth port 414.

Figure 3:
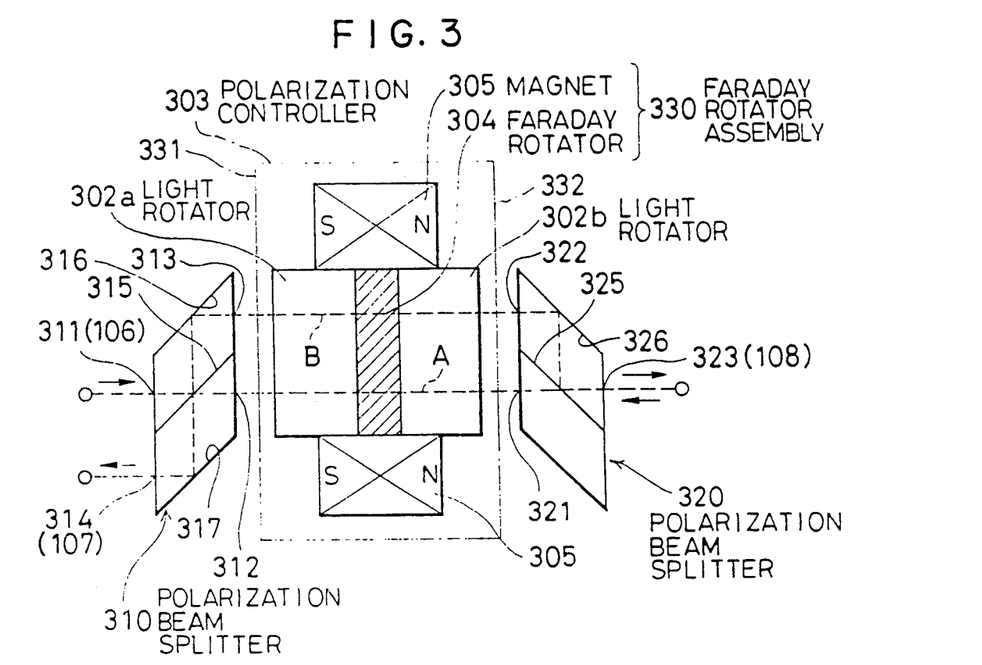
FIG. 3 is a configuration diagram showing a first example of a port separator according to the invention.

The polarization controller 403 comprises light-rotators 402a and 402b, each of which imparts a rotation of 22.5° to light traveling through it, and a Faraday rotator assembly 430 comprising a Faraday rotator 404, provided with an annular magnet 405 surrounding the Faraday rotator 404, having magnetic poles, S and N, at the right and left (as seen in the Figure) ends to create, in the Faraday rotator 404, a magnetic field which is parallel to the direction of travel of light, and reverse to the magnetic field in the Faraday rotator 304 in the example of FIG. 3. The Faraday rotator 404 imparts a rotation of 45° to light traveling through it. The direction of rotation imparted by he light rotators 402a and 402b is invariable, e.g., clockwise, as viewed in the direction of travel. The direction of rotation imparted by the Faraday rotator 404 depends on he direction of travel. For light traveling forward, the direction of rotation given by the Faraday rotator 404 is the same as the direction of rotation given by the light rotators 402a and 402b, i.e., clockwise. For light traveling backward, the direction of rotation given by he Faraday rotator is reverse to the direction of rotation given by the light rotators 402a and 402b, i.e., counterclockwise. The net rotation through the polarization controller 403 during the forward travel therefore is 90°, while the net rotation through the polarization controller 403 during the backward travel is zero.

First, light input from port 106 is reflected at the reflecting plane 417, split into a P-polarized, first light component and an S-polarized, second light component at the polarization splitting plane 415, polarization beam splitter 410. The P-polarized, first light component is reflected at the reflecting plane 416, propagates through the polarization controller 403 along a path C in FIG. 4; the S-polarized light propagates along a path D; and both arrive at the second end 432. The directions of polarization of the first and the second light components which have arrived receive, as they pass through the polarization controller 403, a 45° rotation due to the Faraday rotator 404 and, in addition, a 45° rotation in the same direction due to light-rotators 402a and 402b; therefore, the net rotation is 90°, i.e., the directions of polarization of the light component as they are output at the second end 432 are rotated 90° relative to the directions of polarization as they are input at the first end 431.

The two light components emitted at the second end 432 are input to the second beam splitter 420. The light component having traveled along the path C is S-polarized with respect to the polarization splitting plane 425, and hence is reflected at the polarization splitting plane 425, while the light component having traveled along the path D is P-polarized with respect to the polarization splitting plane 425, and therefore passes through the polarization splitting plane 425. The two light components are therefore merged at the polarization splitting plane 425, and are emitted out from the port 423.

On the other hand, light (backward light) input from the semiconductor laser 102 via the port 423 is split into a first backward light component which is S-polarized with respect to the polarization splitting plane 425 and a second backward light component which is P-polarized with respect to the polarization splitting plane 425, at the polarization splitting plane 425.

The first backward light component and the second backward light component propagate through the polarization controller 403 along the paths C and D in FIG. 4, in the backward direction. As they travel, they receive a 45° rotation due to the Faraday rotator 404 and, in addition, a 45° rotation in the reverse direction due to light-rotators 402a and 402b; therefore, the net rotation is zero, i.e., the directions of polarization of the light components as they are output at the first end 431 are the same as the directions of polarization as they are input at the second end 432. The light component having traveled along the path C is S-polarized with respect to the polarization splitting plane 415, and hence is reflected at the polarization splitting plane 425, while the light component having traveled along the path D is P-polarized with respect to the polarization splitting plane 415, and therefore passes through the polarization splitting plane 415. The two light components are therefore merged at the polarization splitting plane 415, and are emitted out from port 414.

In this way, the port separator of the above configuration separates light from port 106 and directs it to port 108 and separates light from port 108 and directs it to port 107; and furthermore, this function s valid for light having an arbitrary direction of polarization.

This example of a port separator thus has a similar function to that of the example shown in FIG. 3.

Furthermore, in the example of the port separators shown in FIG. 3 and FIG. 4, a phase difference will occur between the two light components since paths over which they propagate are different; however, this phase difference can be easily eliminated by placing a light-phase-adjusting glass block in the shorter propagation path.

Figure 5:
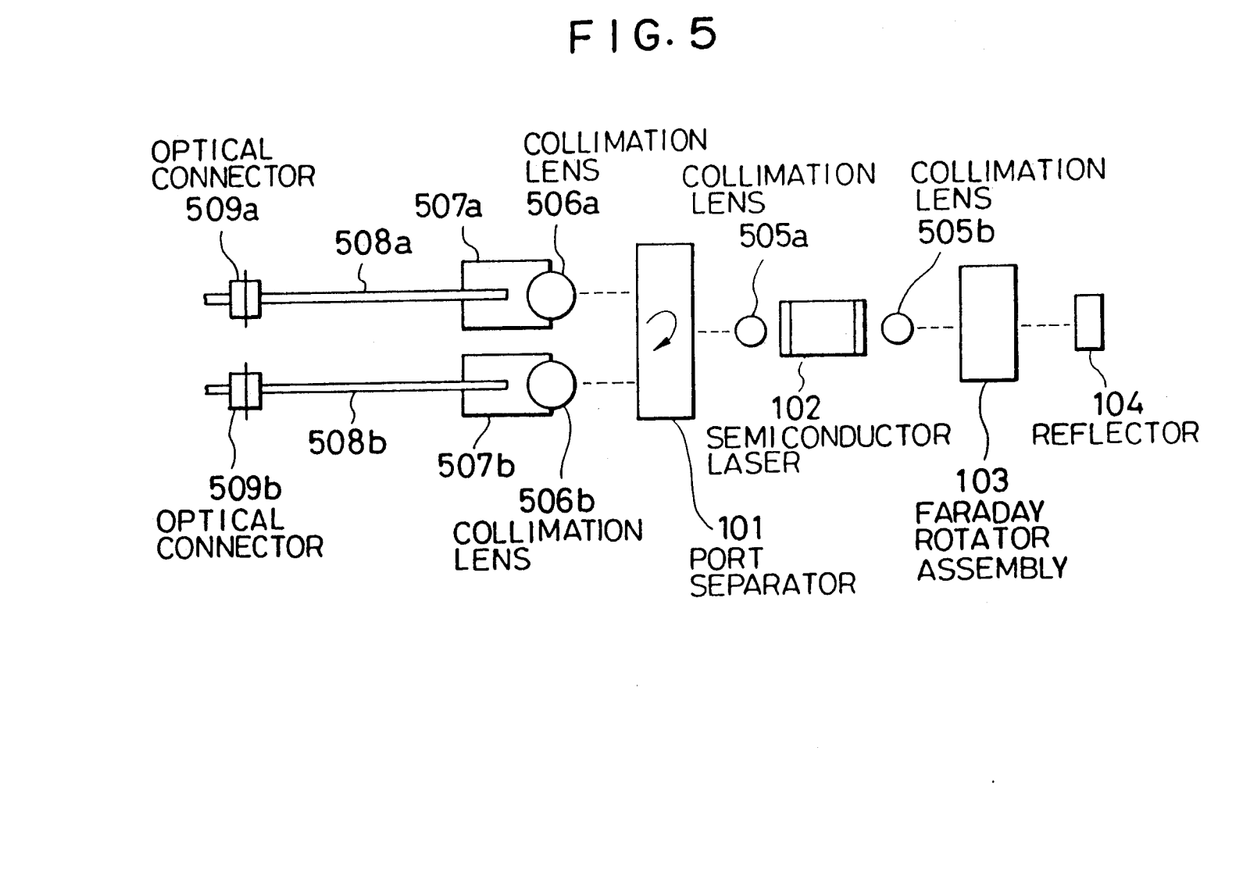
FIG. 5 is a block diagram of a first embodiment of the invention.

FIG. 5 is a block diagram showing an example of an optical amplifier according to the invention. In the diagram, the members denoted by the same reference numerals as in FIG. 1 are identical or similar to those in FIG. 1.

Light input from the outside travels through an optical connector 509a and an optical fiber 508a, is injected into a fiber collimator 506a, and, from a collimation lens 507a, is emitted out to the port separator 101 as parallel light rays. Light incident on the port separator 101 passes through the semiconductor laser 102, the Faraday rotator assembly 103 and the reflector 104, during which it is optically amplified in a way similar to that of the case of FIG. 1 and is emitted from the port separator to a collimation lens 506b as parallel light rays. Light emitted outward is incident on an optical fiber 508b by a fiber collimator 507b and, via an optical connector 509b, is emitted outward.

In the configuration of the embodiment, with the exception of the input and the output optical fibers 508a and 508b, no optical fibers are used at all in he optical amplifier itself; therefore, the configuration is simple and suited to miniaturization.

Figure 6:
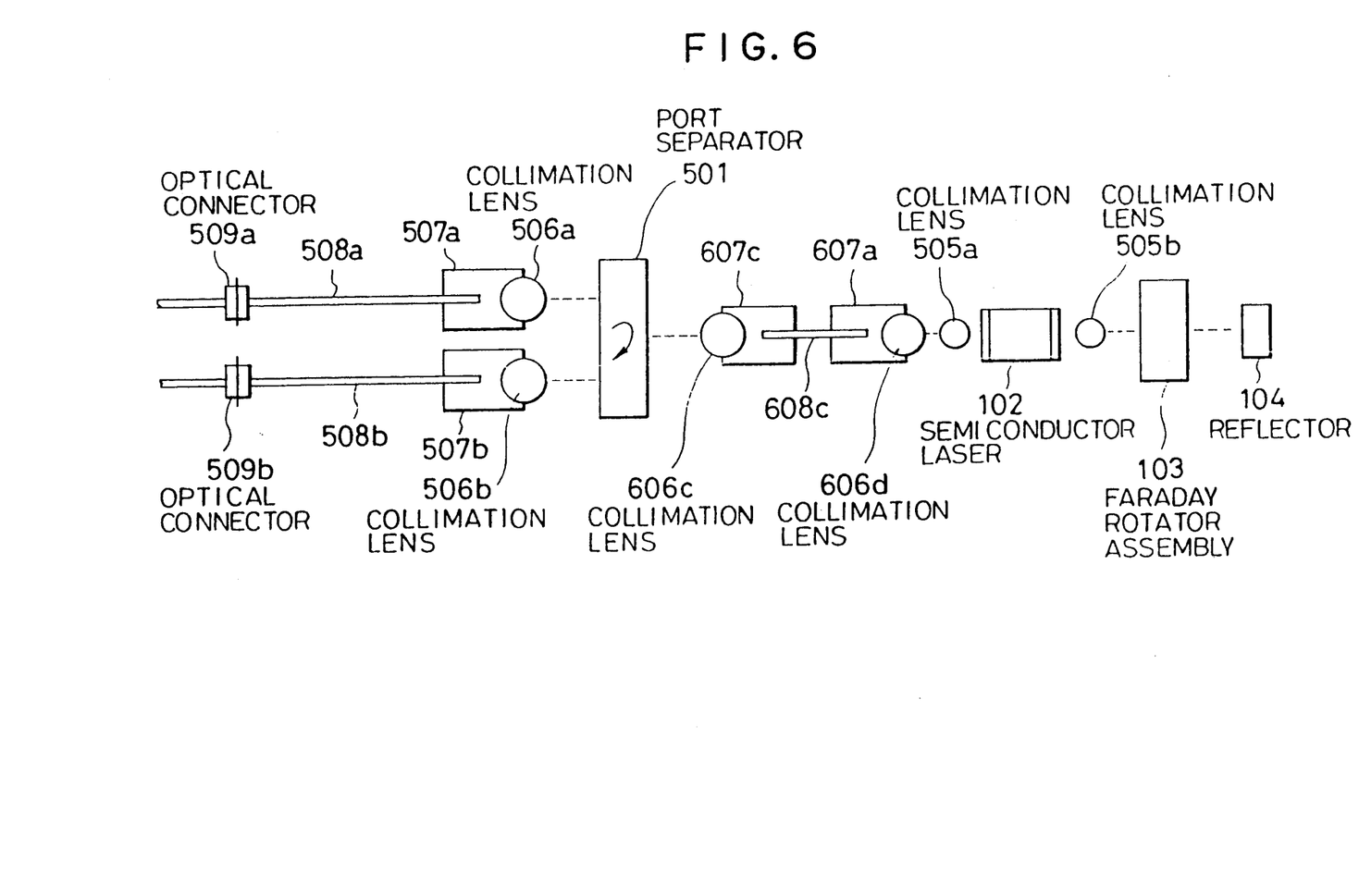
FIG. 6 is a block diagram of a second embodiment of the invention.

FIG. 6 is a block diagram showing another embodiment of an optical amplifier according to the invention. A difference of this embodiment from the embodiment shown in FIG. 5 is that in place of the collimation lens 505a in FIG. 5., a combination of collimation lenses 606a and 606d, fiber collimators 607c and 607d; and an optical fiber 608c is used to optically couple the port separator 101 and the semiconductor laser 102.

With this configuration, it is possible to separately assemble a section centering around the port separator 101 and a second centering around the semiconductor laser 102, and the Faraday rotator assembly 103; this is beneficial in terms of speedy assembly.

As described in detail above, with this invention, it is possible to create an optical amplifier which has a degree of amplification independent of the direction of polarization since a light beam to be amplified is passed back and forth through a semiconductor laser which has a degree of amplification dependent on the direction of polarization of input light and since the direction of polarization of light on its forward path and backward path is mutually orthogonal.

In addition, even if a non-reflective layer on an end of the semiconductor laser is imperfect, and a portion of the input light is reflected, this light is emitted outward. It may be reflected at an optical connector. The reflected light then enters the port separator. But this reflected light is not returned to the the semiconductor laser by virtue of the port separator. Increase in noise can therefore be prevented.

What is claimed is:

1. An optical amplifier for directly amplifying an optical signal regardless of the direction of polarization of the optical signal, said optical amplifier comprising:
   a port separator including:
      a first polarization beam splitter having first, second, third and fourth ports, receiving input light at said first port, splitting the input light into a first light component having a direction of polarization and a second light component having a direction of polarization perpendicular to the direction of polarization of said first light component, and emitting said first and said second light components at said second and said third ports;
      a polarization controller having first and second ends, receiving said first and said second light components at said first end, permitting passage of said first and said second light components from said first end to said second end, imparting a first net amount of rotation to said first and said second light components as they travel from said first end to said second end, and emitting said first and said second light components from said second end; and
      a second polarization beam splitter having first, second and third ports, receiving, at said first and said second ports, said first and said second components emitted from said second end of said polarization controller and merging said first and said second light components, and emitting the merged light components from the third port;

a semiconductor laser that has first and second ends, that emits outward from the second end, light which has been incident on the first end and amplified, and that emits outward, from the first end, light which has been incident on the second end and amplified;

said first end of the semiconductor laser being optically coupled with said third port of the second polarization beam splitter;

a Faraday rotator assembly that has first and second ends, that imparts a first amount of rotation to the direction of polarization of light incident on the first end and emits that light from the second end, and that imparts a second amount of rotation to the direction of polarization of light incident on the second end and emits that light from the first end;

the sum of said first amount of rotation and said second amount of rotation being 90°;

said first end of the Faraday rotator assembly being optically coupled with said second end of the semiconductor laser; and a reflector that reflects light coming from the second end of the Faraday rotator assembly and returns it back towards the second end of the Faraday rotator assembly wherein said second polarization beam splitter receives, at said third port, reflected back light from said semiconductor laser, splits the received reflected back light into a first backward light component having a direction of polarization and a second backward light components having a direction of polarization perpendicular to the direction of polarization of said first backward light component, and emits the first and the second backward light components from said first and said second ports;

said polarization controller receives said first and said second backward light components at said second end, and permits passage of said first and said second backward light components from said second end to said first end, imparts a second net amount of rotation to said first and said second backward light components as they travel from said second end to said first end, emits the first and said second backward light at said first end, one of said first net amount of rotation and said second net amount of rotation being 0 and the other of said first and said second net amount of rotation being 90°; and said first polarization beam splitter receives at said second and said third ports, said first and said second backward light components, merges them, and emits the merged backward light components from said fourth port.

2. An optical amplifier of claim 1, wherein said first amount of rotation is a 45° rotation and said second amount of rotation is a 45° rotation in the same direction.

3. An optical amplifier of claim 1, wherein an optical fiber is interposed between the port separator and the semiconductor laser.

4. An optical amplifier of claim 1, further comprising a first fiber collimator optically coupled by a first collimation lens to said third port of the second polarization beam splitter and a second fiber collimator optically coupled by a second collimation lens to said first end of said semiconductor laser, and an optical fiber optically collimation together said first and said second fiber collimators.

* * * * *